(12) United States Patent
MacNeil

(10) Patent No.: US 6,846,757 B2
(45) Date of Patent: Jan. 25, 2005

(54) DIELECTRIC LAYER FOR A SEMICONDUCTOR DEVICE AND METHOD OF PRODUCING THE SAME

(75) Inventor: John MacNeil, Heath (GB)

(73) Assignee: Trikon Holdings Limited, Gwent (GB)

( * ) Notice: Subject to any disclaimer, the term of this patent is extended or adjusted under 35 U.S.C. 154(b) by 52 days.

(21) Appl. No.: 10/638,424

(22) Filed: Aug. 12, 2003

(65) Prior Publication Data

US 2004/0053459 A1 Mar. 18, 2004

Related U.S. Application Data

(60) Division of application No. 09/942,933, filed on Aug. 31, 2001, now Pat. No. 6,653,247, which is a continuation-in-part of application No. 09/914,204, filed as application No. PCT/GB00/00671 on Feb. 24, 2000.

(30) Foreign Application Priority Data

Feb. 26, 1999 (GB) .............................................. 9904427
Sep. 28, 1999 (GB) .............................................. 9922801
Jan. 14, 2000 (GB) .............................................. 0000780

(51) Int. Cl.[7] ...................... H01L 21/26; H01L 21/324; H01L 21/42
(52) U.S. Cl. ............... 438/798; 438/795; 257/E21.241; 257/E21.252; 257/E21.274
(58) Field of Search ................................ 438/795, 798; 257/E21.241, E21.252, E21.274

(56) References Cited

U.S. PATENT DOCUMENTS

| 3,223,040 A | 12/1965 | Dinkelkamp |
| 4,096,315 A | 6/1978 | Kubacki |
| 4,793,524 A | 12/1988 | Starr |

(List continued on next page.)

FOREIGN PATENT DOCUMENTS

| DE | 19654 737 A1 | 12/1996 |
| EP | 0 212 691 A1 | 3/1987 |
| EP | 0159079 | 12/1992 |
| EP | 0 519 079 A1 | 12/1992 |
| EP | 0 529 334 A2 | 3/1993 |
| EP | 0 726 599 A2 | 8/1996 |
| EP | 0 761 841 A1 | 3/1997 |
| EP | 0 254 205 A2 | 1/1998 |
| EP | 0 826 791 A2 | 3/1998 |
| GB | 2 108 133 A | 5/1983 |
| GB | 2 111 064 A | 6/1983 |
| GB | 2 220 869 A | 1/1990 |
| GB | 2 280 169 A | 1/1995 |
| WO | WO 94/01885 | 1/1994 |
| WO | WO 96/29576 | 9/1996 |
| WO | WO 98/08249 | 2/1998 |
| WO | WO 98/23787 | 6/1998 |
| WO | WO 99/43866 | 9/1999 |
| WO | WO 00/51174 | 8/2000 |
| WO | WO 01/01472 A1 | 1/2001 |

OTHER PUBLICATIONS

EPO, Patent Abstracts of Japan, Publication No. 10310866, Publication Date Nov. 24, 1998, Kamiya Kazuo.
A. Grill et al., "Low dielectric constant films prepared by plasma–enhanced chemical vapor deposition from tetramethylsilane," Journal of Applied Physics, Volumn 85, No. 6, Mar. 15, 1999, pp. 3314–3318.

*Primary Examiner*—Alexander Ghyka
(74) *Attorney, Agent, or Firm*—Volentine Francos, PLLC

(57) ABSTRACT

A semiconductor device includes a low dielectric constant insulating film exhibiting an Si—H Fourier Transform Infrared (FTIR) doublet defined by a first and a second peak, wherein the first peak is located at a higher wave number than the second peak, and wherein the ratio of the first peak to the second peak is greater than unity. A method of producing such a semiconductor device includes depositing a dielectric layer over a substrate and treating the dielectric layer in a hydrogen containing plasma such that the dielectric layer exhibits an Si—H Fourier Transform Infrared (FTIR) doublet defined by a first and a second peak, wherein the first peak is located at a higher wave number than the second peak, and wherein the ratio of the first peak to the second peak is greater than unity.

4 Claims, 17 Drawing Sheets

U.S. PATENT DOCUMENTS

| | | |
|---|---|---|
| 4,822,632 A | 4/1989 | Williams et al. |
| 4,894,254 A | 1/1990 | Nakayama et al. |
| 5,095,938 A | 3/1992 | Garrison |
| 5,098,741 A | 3/1992 | Nolet et al. |
| 5,195,655 A | 3/1993 | Bukhman |
| 5,270,267 A | 12/1993 | Ouellet |
| 5,273,851 A | 12/1993 | Takei et al. |
| 5,314,724 A | 5/1994 | Tsukune et al. |
| 5,356,034 A | 10/1994 | Schlumberger |
| 5,494,712 A | 2/1996 | Hu et al. |
| 5,534,069 A | 7/1996 | Kuwabara et al. |
| 5,593,741 A | 1/1997 | Ikeda |
| 5,620,524 A | 4/1997 | Fan et al. |
| 5,641,559 A | 6/1997 | Namiki |
| 5,723,368 A * | 3/1998 | Cho et al. .................. 438/624 |
| 5,730,804 A | 3/1998 | Gomi et al. |
| 5,786,039 A | 7/1998 | Brouquet |
| 5,876,503 A | 3/1999 | Roeder et al. |
| 6,303,094 B1 * | 10/2001 | Kusunoki et al. ......... 423/447.1 |
| 6,713,234 B2 * | 3/2004 | Sandhu et al. .............. 430/313 |
| 2003/0031789 A1 * | 2/2003 | Bedwell et al. .......... 427/248.1 |

* cited by examiner

US 6,846,757 B2

DIELECTRIC LAYER FOR A SEMICONDUCTOR DEVICE AND METHOD OF PRODUCING THE SAME

CROSS-REFERENCES TO RELATED APPLICATIONS

This is a divisional of U.S. patent application Ser. No. 09/942,933, filed Aug. 31. 2001 now U.S. Pat. No. 6,653,247, which is a continuation-in-part of U.S. patent application Ser. No. 09/914,204, filed Feb. 20, 2002 which is the U.S. National Phase of International Application No. PCT/GB00/00671, filed Feb. 24, 2000, the entire contents of each of which are hereby incorporated herein by reference for all purposes as if fully set forth herein.

BACKGROUND OF THE INVENTION

1. Field of the Invention

The present invention generally relates to dielectric films having a polymer layer, such as a short chain polymer layer, including Si—C bonds, and in particular to low dielectric constant films of the type, for example, that are used as insulating layers on semiconductor wafers, and methods of producing such insulating layers.

2. Description of the Related Art

The desire to produce semiconductor wafers with high device densities and high speeds has led to a search for low dielectric constant (low k value) films for use as insulating layers in semiconductor devices. Such a dielectric film can be either spun on or deposited using, for example, a chemical vapor deposition process. The dielectric film is then usually heated to harden it. Recent work has been particularly directed to films consisting of polymer layers including Si—C bonds and the Applicants' International Patent Application WO 98/08249 describes, by way of example, such a process for depositing such a film.

The reduction in dielectric constant in such films seems to derive from a decreased density of the film, possibly due to a disruption of the lattice by the carbon atoms present in the film.

The dielectric material is formed or deposited upon the wafer as a short chain polymer that is further polymerized and hardened by heating to between 400° C. and 500° C., typically in a nitrogen atmosphere of between 30 mTorr and 20 Torr, and more generally in the absence of oxygen at any convenient pressure.

It has become apparent, however, that at least some dielectric films of this sort are susceptible to cracking, particularly at the wafer edge. Typically such cracking begins to occur at a nominal film thickness of about 5000–6000 Å. The cause seems in part to be due to a dramatic increase in film thickness within 1 mm of the wafer edge. The cracking appears only to occur following exposure to atmosphere and aggressively travels in towards the center over a period of about 24 hours. The rate of cracking can be delayed by keeping the wafers in vacuum, but eventually they do crack when exposed to atmosphere.

It has also become apparent that the dielectric constant (k value) of some dielectric films formed in this manner increases significantly from its initial value after a period of time. For example, experiments on two samples of dielectric films formed in this manner exhibited initial k values of approximately 2.84 and 2.88, but after 48 hours the k values of the samples had increased to approximately 2.92 and 2.99 respectively.

Accordingly, it would be advantageous to provide a semiconductor device having a dielectric film with a low dielectric constant (k value). It would also be advantageous to provide such a device including a low k value dielectric film that is less susceptible to cracking, and methods of producing such dielectric films. Other and further objects and advantages will appear hereinafter.

SUMMARY OF THE INVENTION

The present invention comprises a semiconductor device having a low k value dielectric layer and a method of making such a semiconductor device and dielectric layer.

In one aspect of the invention, a semiconductor device includes a dielectric layer having a methyl group and exhibiting an Si—H Fourier Transform Infrared (FTIR) doublet defined by a first and a second peak, wherein the first peak is located at a higher wave number than the second peak, and wherein the ratio of the first peak to the second peak is greater than unity.

In another aspect of the invention, a semiconductor device includes a dielectric layer having a methyl group and exhibiting a C—H FTIR peak, an Si—CH$_3$ FTIR peak, and an Si—H FTIR doublet defined by a first and a second peak, wherein the first peak is located at a higher wave number than the second peak, and wherein the ratio of the first peak to the second peak is greater than unity.

In yet another aspect of the invention, a method of treating a dielectric layer comprises exposing the dielectric layer to a hydrogen-containing plasma such that a ratio between a higher wave number peak to a lower wave number peak of a Si—H FTIR doublet is changed from less than unity to greater than unity.

In yet another aspect of the invention, a method of fabricating a semiconductor device comprises depositing a dielectric layer over a substrate and treating the dielectric layer in a hydrogen containing plasma such that the dielectric layer exhibits an Si—H FTIR doublet defined by a first and a second peak, wherein the first peak is located at a higher wave number than the second peak, and wherein the ratio of the first peak to the second peak is greater than unity.

In still another aspect of the invention, a method of fabricating a semiconductor device comprises depositing a dielectric layer over a substrate and treating the dielectric layer in a hydrogen containing plasma such that the dielectric layer exhibits a C—H Fourier Transform Infrared (FTIR) peak, an Si—CH$_3$ FTIR peak, and an Si—H FTIR doublet defined by a first and a second peak, wherein the first peak is located at a higher wave number than the second peak, and wherein the ratio of the first peak to the second peak is greater than unity.

Other and further objects and advantages will appear hereinafter.

BRIEF DESCRIPTION OF THE DRAWINGS

Specific embodiments of the present invention will now be described by way of example with reference to the accompanying drawings, briefly described below.

DETAILED DESCRIPTION OF THE PREFERRED EMBODIMENTS

Figure 1:
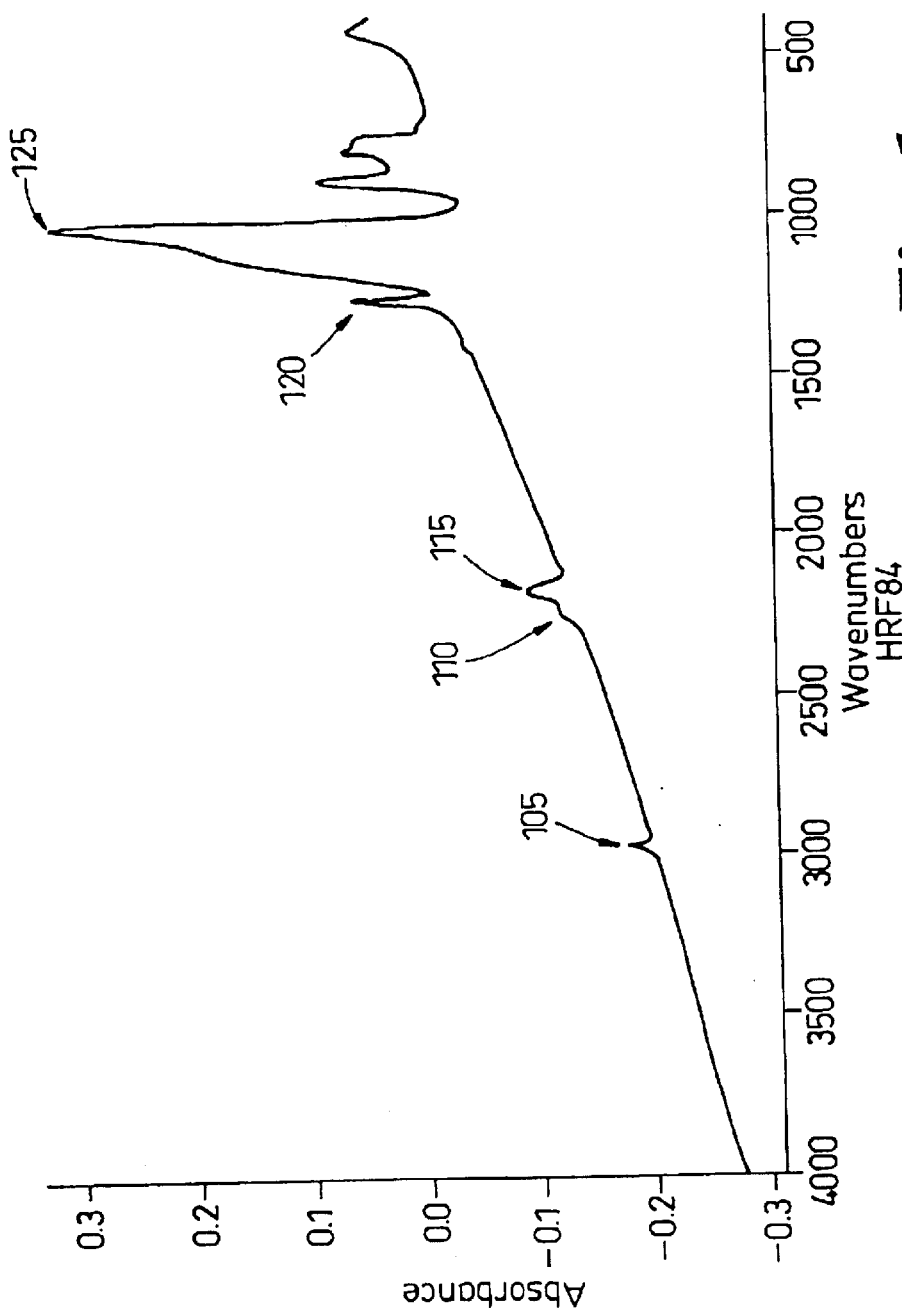
FIG. 1 shows Fourier Transform Infrared (FTIR) data for a sample dielectric film prepared in accordance with a first set of process conditions.
Figure 2:
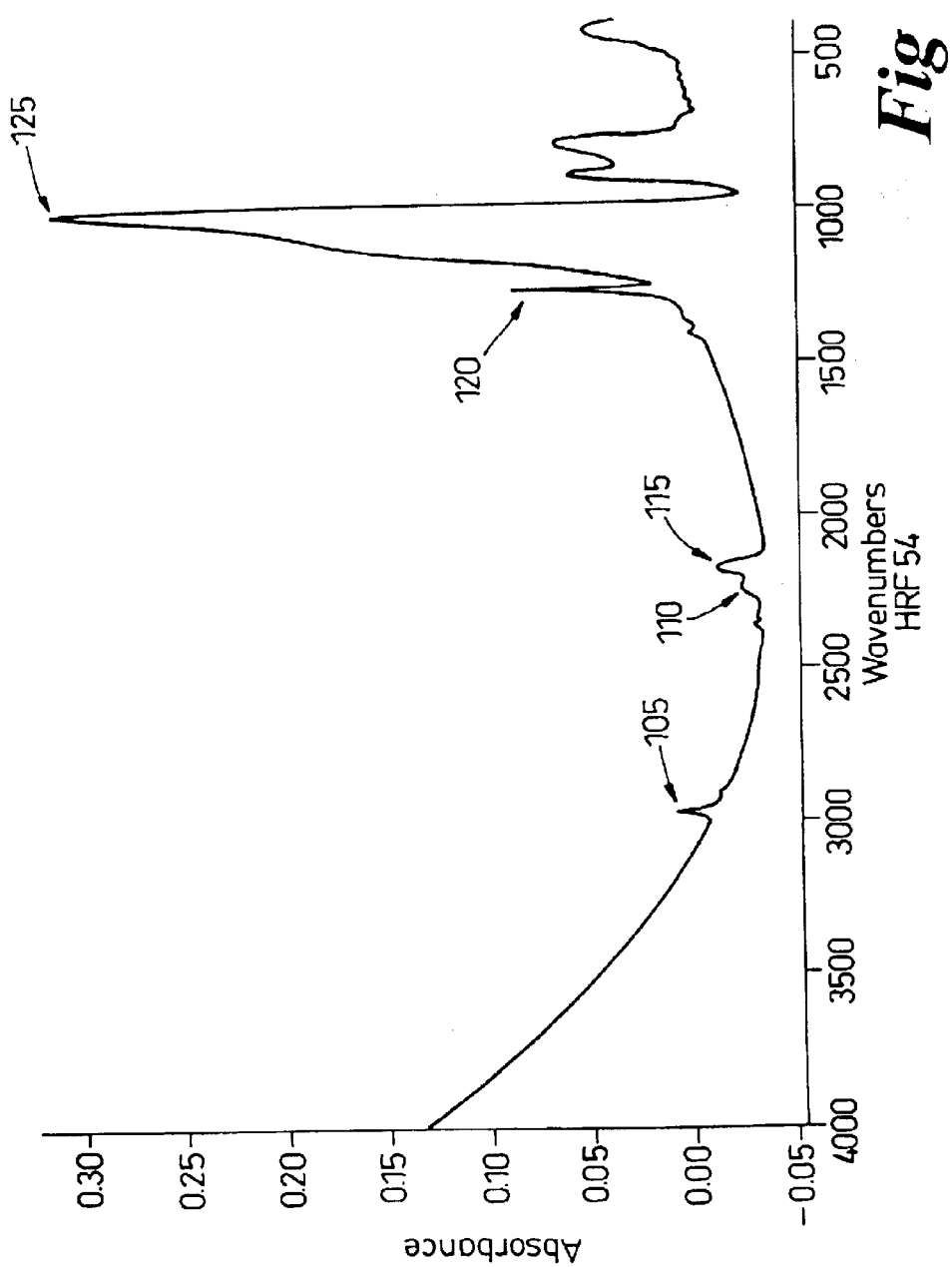
FIG. 2 shows FTIR data for a sample dielectric film prepared in accordance with a second set of process conditions.
Figure 3:
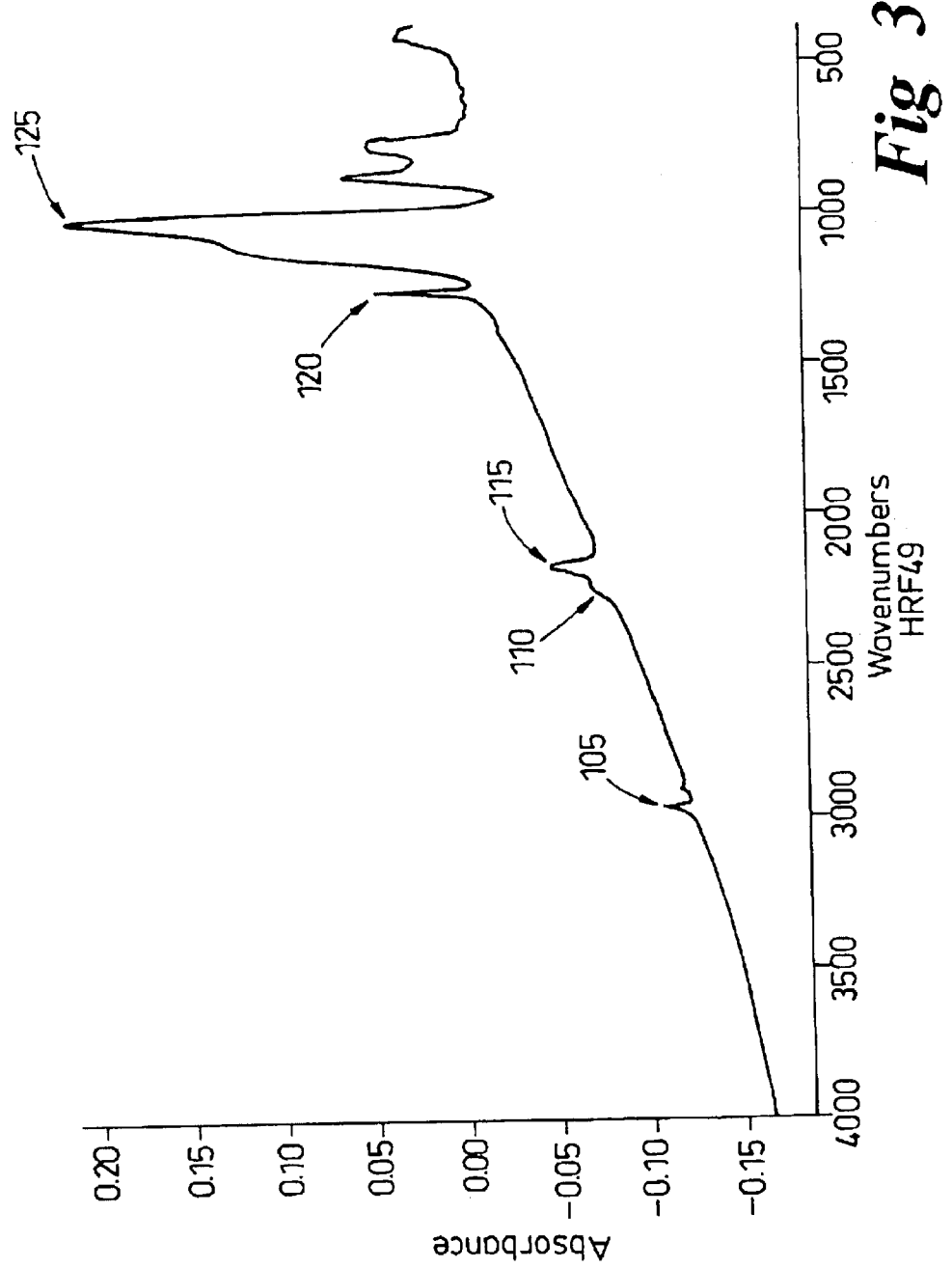
FIG. 3 shows FTIR data for a sample dielectric film prepared in accordance with a third set of process conditions.
Figure 4:
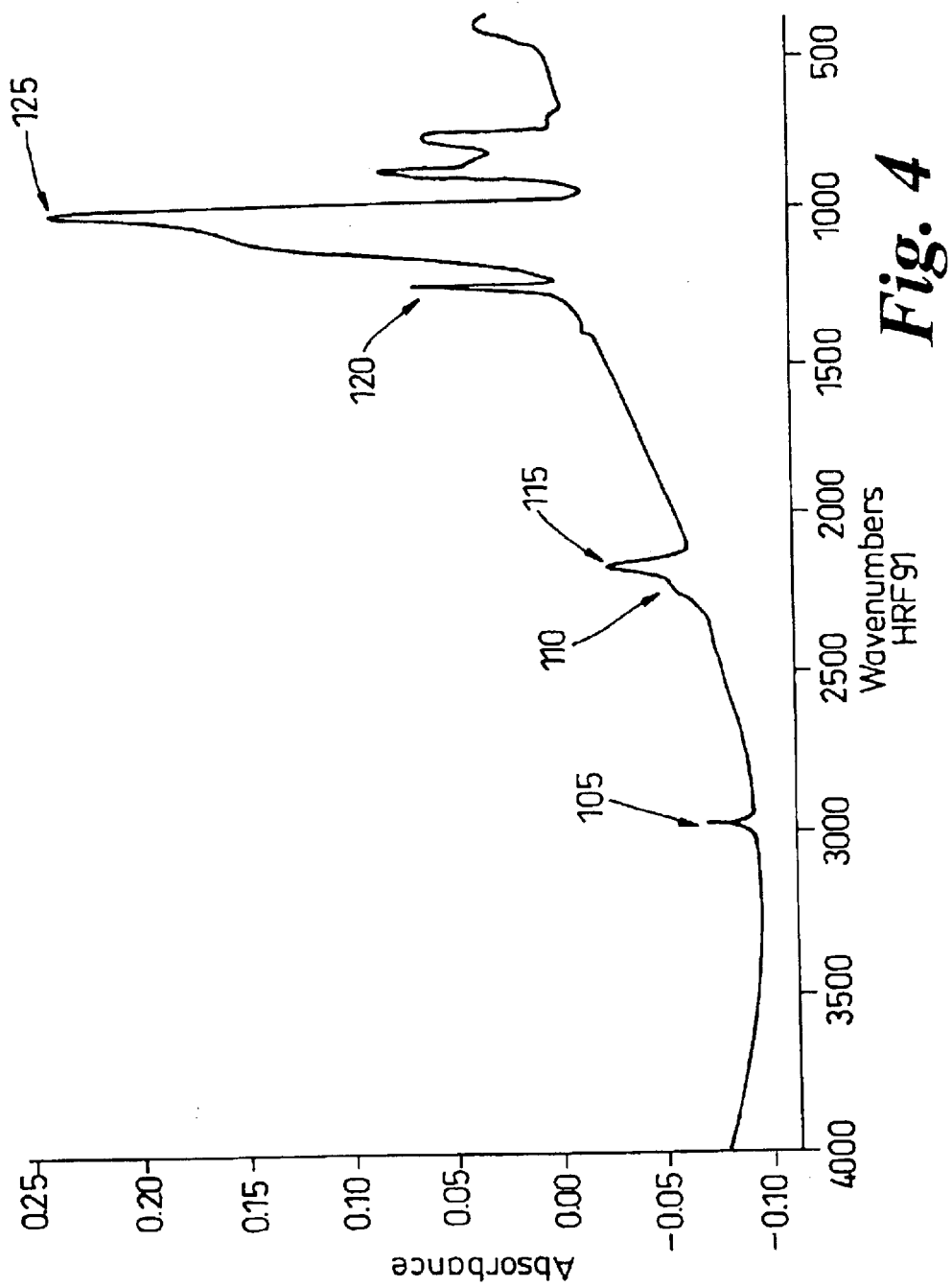
FIG. 4 shows FTIR data for a sample dielectric film prepared in accordance with a fourth set of process conditions.
Figure 5:
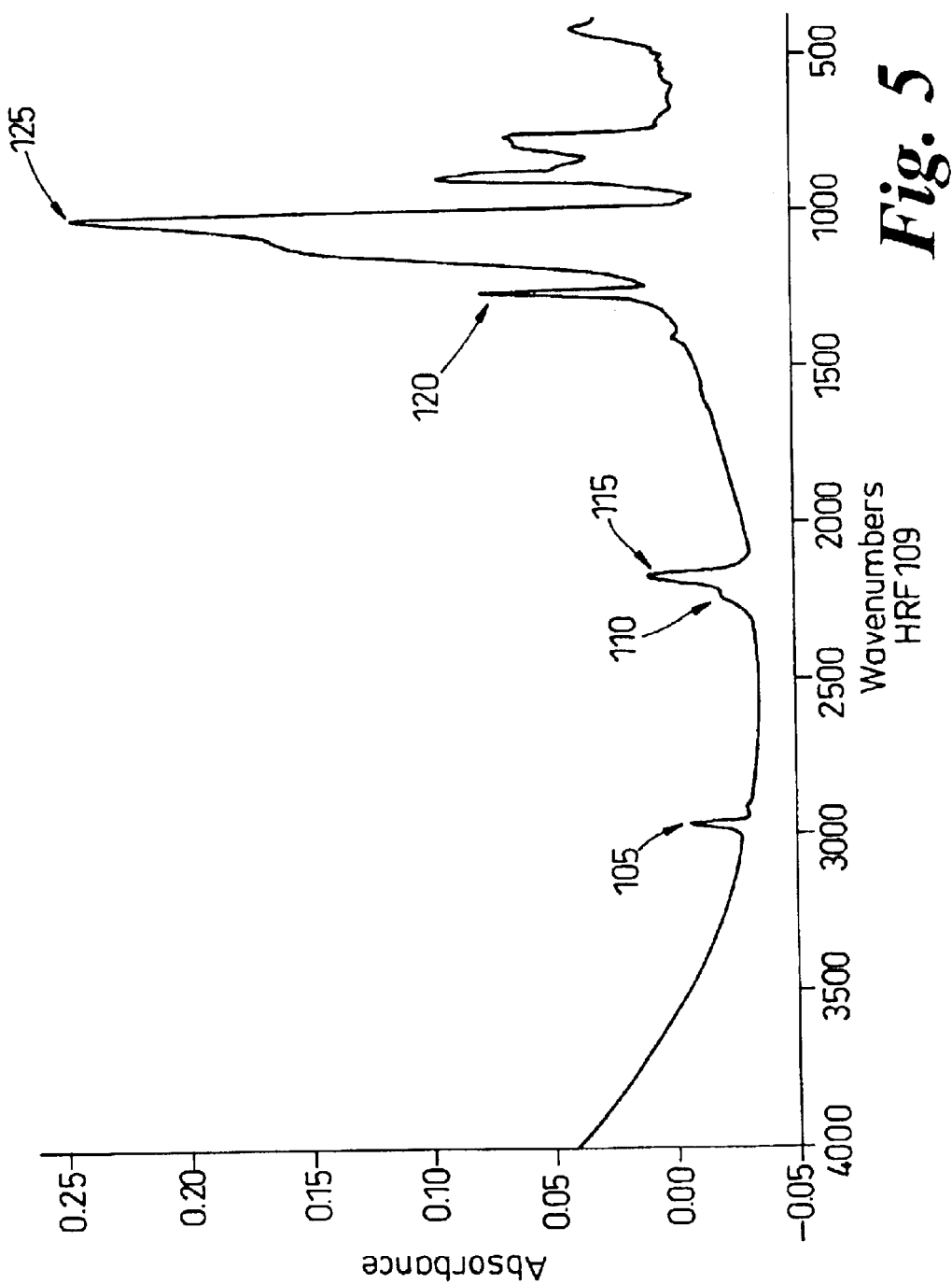
FIG. 5 shows FTIR data for a sample dielectric film prepared in accordance with a fifth set of process conditions.

Experiments were run to monitor k (dielectric constant) values and Fourier Transform Infrared (FTIR) spectra of insulating layers, or films, produced under a variety of process conditions. The k values were measured on low resistivity silicon MOS structures.

FIGS. 1 to 5 show the FTIR spectra of short-chain polymer insulating layers deposited under the corresponding process conditions shown in Table 1, below. The deposition of the insulating layers onto silicon wafers was carried out in a standard chemical vapor deposition process. In each case, after deposition, the thus deposited short-chain polymer layer was subjected to a standard vacuum thermal cure at approximately 450° C. for 5 minutes.

TABLE 1

| FIG. | Pressure (mTorr) | Peroxide Flow (g/min.) | MeSiH$_3$ Flow (sccm) | Platen Temp (° C.) | Showerhead Temp (° C.) | K value |
|---|---|---|---|---|---|---|
| 1 | 1000 | 0.75 | 120 | 0 | 100 | 2.7 |
| 2 | 1600 | 0.4 | 80 | 5 | 80 | 2.55 |
| 3 | 1400 | 0.4 | 80 | 0 | 80 | 2.51 |
| 4 | 1700 | 0.255 | 60 | 0 | 80 | 2.49 |
| 5 | 1700 | 0.3 | 60 | 1 | 80 | 2.41 |

As can be seen from FIGS. 1–5, in each of these cases where the standard vacuum thermal cure was employed, the FTIR spectra exhibits the following characteristics: a C—H FTIR peak 105 at approximately 2900 cm$^{-1}$; two Si—H FTIR peaks (a Si—H doublet) 110, 115 at approximately 2250 cm$^{-1}$ and 2125 cm$^{-1}$ respectively; a Si—CH$_3$ FTIR peak 120 at approx. 1250 cm$^{-1}$; and an Si—O FTIR peak 125 at approximately 1100 cm$^{-1}$. In the case of the Si—H doublet, the magnitude of the peak 115 for the lower wave number is greater than the magnitude of the peak 110 for the higher wave number.

Figure 6:
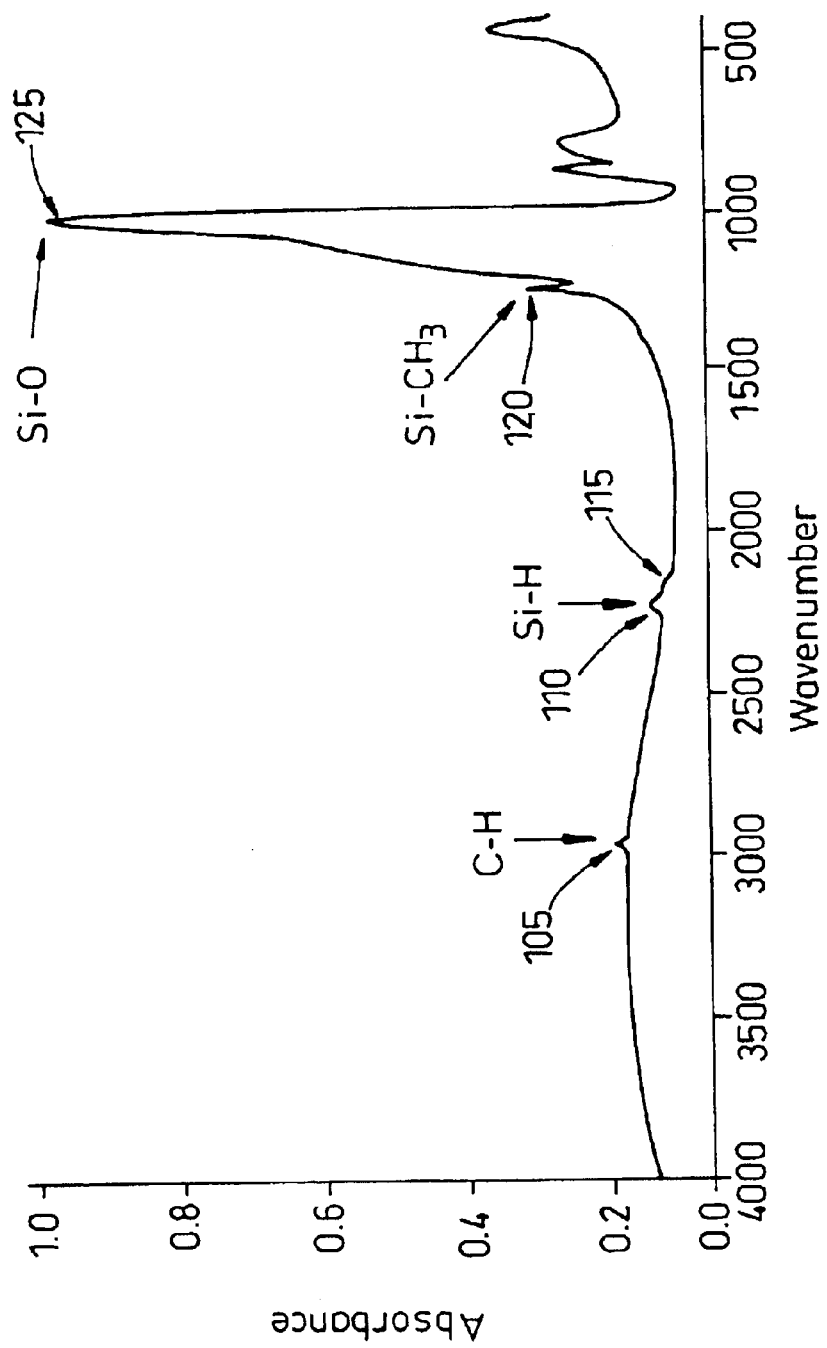
FIG. 6 shows FTIR data for a sample dielectric layer prepared in accordance with an embodiment of the invention.

FIG. 6 shows the FTIR spectra of an insulating layer deposited under the process conditions of Table 2, below, wherein the thus deposited short-chain polymer layer was then subjected to a heat treatment, but this time with a coincident plasma applied via an inductively coupled electrode. The plasma processing conditions are given in Table 3, below.

TABLE 2

| FIG. | Pressure (mTorr) | Peroxide Flow (g/min.) | MeSiH$_3$ Flow (sccm) | Platen Temp (° C.) | Showerhead Temp (° C.) | K value |
|---|---|---|---|---|---|---|
| 6 | 1000 | 0.5 | 100 | 2 | 100 | 2.4 |

TABLE 3

| H$_2$ Flow (sccm) | Pressure (Torr) | RF Power (mTorr) | RF Frequency (MHz) | Platen Temp (° C.) | Electrode Spacing (mm) |
|---|---|---|---|---|---|
| 1000 | 4 | 1 kW | 13.56 | 400 | 6 |

In general, the plasma mode may comprise the following: 1) Reactive Ion Etch (RIE) mode; (2) Diode (capacitively coupled electrode) mode; (3) inductively coupled plasma (ICP) mode; or (4) ICP and RIE in combination. However, preferably mode (2) or (3) is employed, i.e., the best results have been obtained where a plasma is present directly at the dielectric layer but is not sustained by powering the substrate platen. Beneficially, a hydrogen plasma is employed which is devoid of nitrogen and oxygen.

Significantly, it will be seen from FIG. 6 that in comparison to the FTIR spectra of FIGS. 1–5 the two Si—H FTIR peaks (the Si—H doublet) 110, 115 of the hydrogen plasma treated dielectric layer are modified. Namely, the Si—H doublet changes upon exposure to the H$_2$ plasma treatment with the lower wave number FTIR peak 115 centered at approximately 2125 cm$^{-1}$ being significantly reduced, while the higher wave number peak FTIR 110 at approximately 2250 cm$^{-1}$ is gradually increased upon increased exposure to the plasma. In the case of the Si—H doublet as shown in FIG. 6, the magnitude of the peak 115 for the lower wave number (approx. 2125 cm$^{-1}$) becomes less than the magnitude of the peak 110 for the higher wave number (approx. 2250 cm$^{-1}$). Meanwhile, the hydrogen plasma treated dielectric layer has substantially improved characteristics such as a much reduced wet etch rate, increased hardness and crack resistance, and there is no significant reduction in k value.

Also, in the example shown in FIG. 6, it is noted that the C—H FTIR peak 105 and the Si—CH$_3$ FTIR peak 120 of the plasma-treated insulating dielectric layer are each suppressed with respect to the corresponding peaks in FIGS. 1–5. Moreover, the peak area ratio of all of these FTIR peaks is reduced.

It has been determined that hydrogen plasma treatment is effective to varying depths dependent on the time of the process and the composition of the dielectric layer. In general the lower the k value the greater the depth of treatment. Thus for a k=2.7 dielectric layer, the treatment penetrated to a depth of 3,000 Å, while with a k=2.4 dielectric layer the depth of treatment was 5,700 Å. Both tests were carried out under the conditions of Table 4, below.

TABLE 4

| $H_2$ Flow (sccm) | Pressure (Torr) | RF Power (mTorr) | RF Frequency (MHz) | Platen Temp (° C.) | Electrode Spacing (mm) |
|---|---|---|---|---|---|
| 1000 | 4 | 1 kW | 13.56 | 400 | 6 |

It has been found that increasing the power level or changing the electrode spacing does not significantly increase the effective depth of the plasma treatment, but increasing the treatment time to 600 seconds increases the depth of treatment on the k=2.7 dielectric layer from 3000 Å to 6000 Å (i.e. twice the time, twice the depth).

Figure 7:
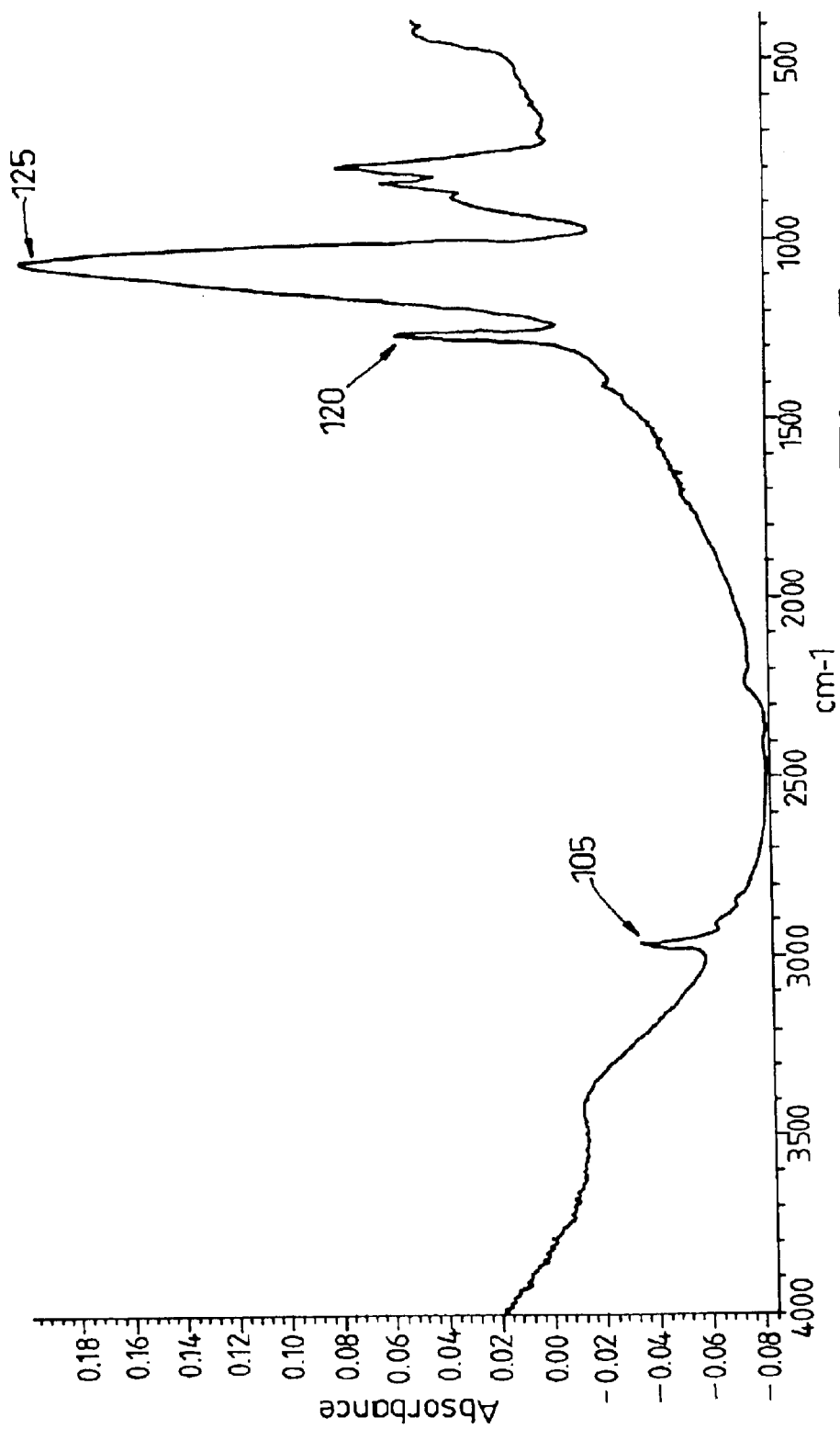
FIG. 7 shows FTIR data for a sample dielectric film prepared with low temperature deposition, prior to thermal cure.

FIG. 7 shows FTIR data for a sample dielectric layer prepared with low temperature plasma deposition (typically<60° C.) using a tetramethylsilane (4MS) and $O_2$ reaction, prior to thermal cure. As deposited, the "cold wafer" dielectric layer is not functionally useful because it has a very high k value due to the abundance of water present in the dielectric layer. As can be seen from FIG. 7, as deposited the dielectric layer has weak, if any, Si—H peaks. Slight modifications in deposition parameters can influence the presence of the Si—H peaks.

Table 5 summarizes key characteristics for low-temperature deposited 4MS/$O_2$ dielectric layer under different post-deposition processes which are described below. A few examples are given for the same process conditions to show a representative range of k values produced.

strate platen. As can be seen from Table 5, these cold deposited dielectric layers react to the hydrogen plasma treatment to yield dielectric constant (k) reductions, compared to the standard vacuum thermal cure. Increasing the $H_2$ plasma treatment time yields lower dielectric constant (k) values.

Figure 11:
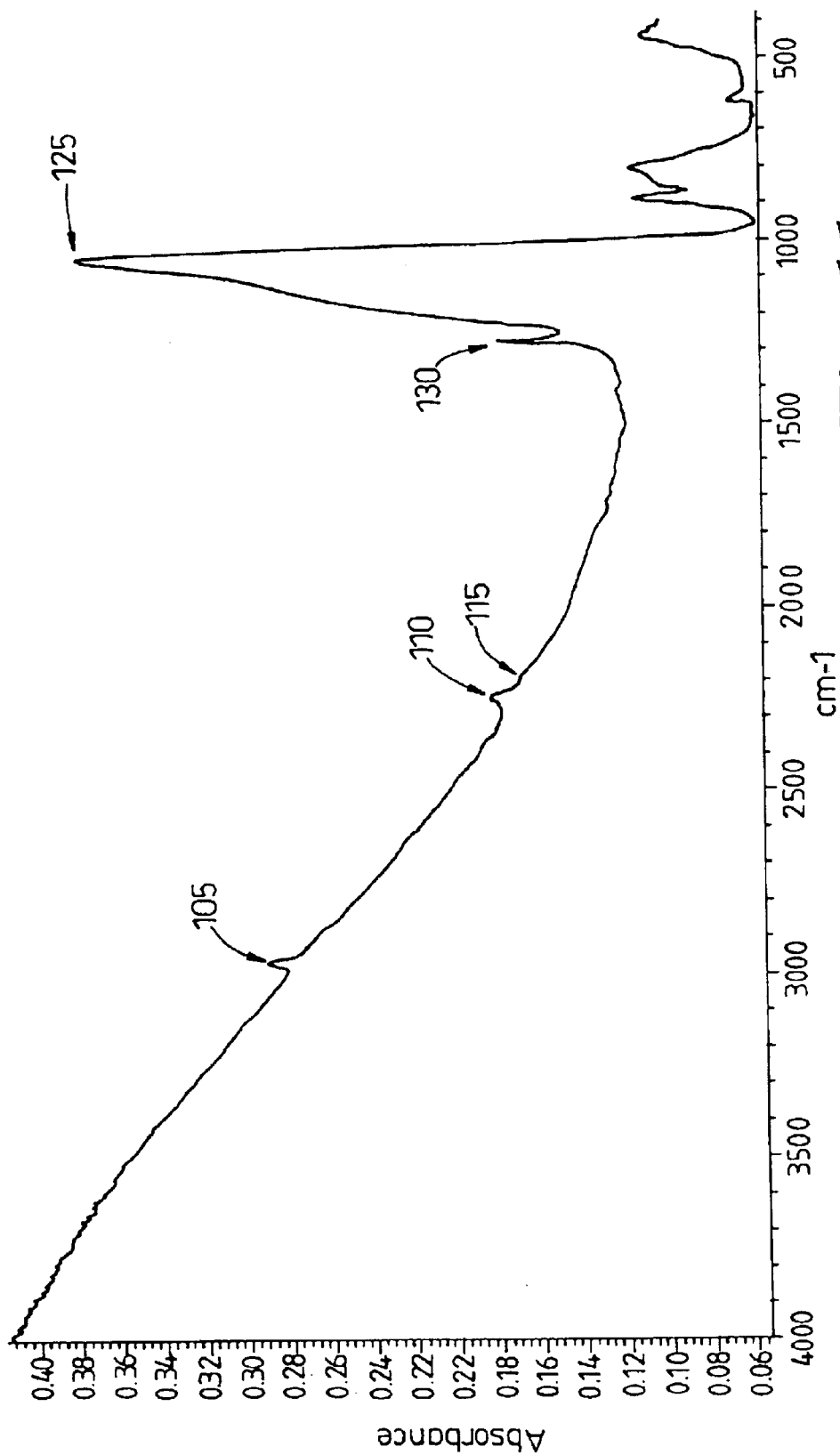
FIG. 11 shows FTIR data for a sample dielectric film prepared with low temperature deposition, after 30 minutes of hydrogen plasma treatment.

Significantly, with increasing $H_2$ plasma time, the relative ratio of the 2250/2125 Si—H FTIR peaks 110, 115 increases. In the case of the Si—H doublet as shown in FIG. 11, the magnitude of the FTIR peak 115 for the lower wave number (approximately 2125 $cm^{-1}$) is less than the magnitude of the FTIR peak 110 for the higher wave number (approximately 2250 $cm^{-1}$). Also, the magnitudes of the C—H FTIR peak 105 and the Si—$CH_3$ FTIR peak 120 are reduced with reference to the thermally cured dielectric layer.

Some broad structure is also observed around the C—H FTIR peak 105. At the present time, it is believed that this is associated with (C—$H_2$)n bonds being formed. This gradual effect with increasing exposure is as a result of the treatment starting at the surface and gradually passing through the layer thickness, as described above and evidenced by wet etch rates, the plasma treated dielectric layer etching much more slowly.

As can be seen from Table 5 above, the hydrogen plasma treatment is more effective (lower k value) if the dielectric layer has not already been heat treated. Also, longer vacuum heat treatments do not significantly reduce k values. These dielectric layers were examined in a transmission electron microscope and to the limits of the microscope's resolution (approximately 5–6 Å), there were no voids.

The dielectric layers as further processed have typical percentage concentrations; carbon 14.5%, silicon 20.5%, oxygen 31% and hydrogen 34%.

Some experiments have been run with trimethylsilane (3MS) and oxygen plasma deposited dielectric layers at low

TABLE 5

| FIG. | Process | k | Refractive Index | FTIR Si—$CH_3$/Si—O | FTIR Si—H/Si—O | FTIR $CH_3$/Si—O |
|---|---|---|---|---|---|---|
| 8 | 450° C. for 5 minutes | 2.746 | 1.3890 | 0.0524 | 0.0075 | 0.032 |
| 8 | 450° C. for 5 minutes | 2.5748 | 1.3889 | 0.0507 | 0.0053 | 0.0299 |
| 9 | $H_2$ plasma for 1 minute | 2.6458 | 1.3880 | 0.0342 | 0.0082 | 0.0359 |
| 10 | $H_2$ plasma for 5 minutes | 2.2738 | 1.43415 | 0.0217 | 0.0168 | 0.0291 |
| 10 | $H_2$ plasma for 5 minutes | 2.3608 | 1.4189 | 0.0232 | 0.0145 | 0.0253 |
| — | 450° C. for 5 mins. followed by $H_2$ plasma for 5 minutes | 2.53 | 1.4197 | 0.0257 | 0.0189 | 0.022 |
| — | $H_2$ plasma for 10 minutes | 2.0608 | 1.4601 | 0.0290 | 0.0163 | 0.0229 |
| — | $H_2$ plasma for 10 minutes | 2.15 | 1.4702 | 0.0162 | 0.0198 | 0.0246 |
| 11 | $H_2$ plasma for 30 minutes | 1.7938 | 1.5435 | 0.0174 | 0.0174 | 0.0166 |

Figure 8:
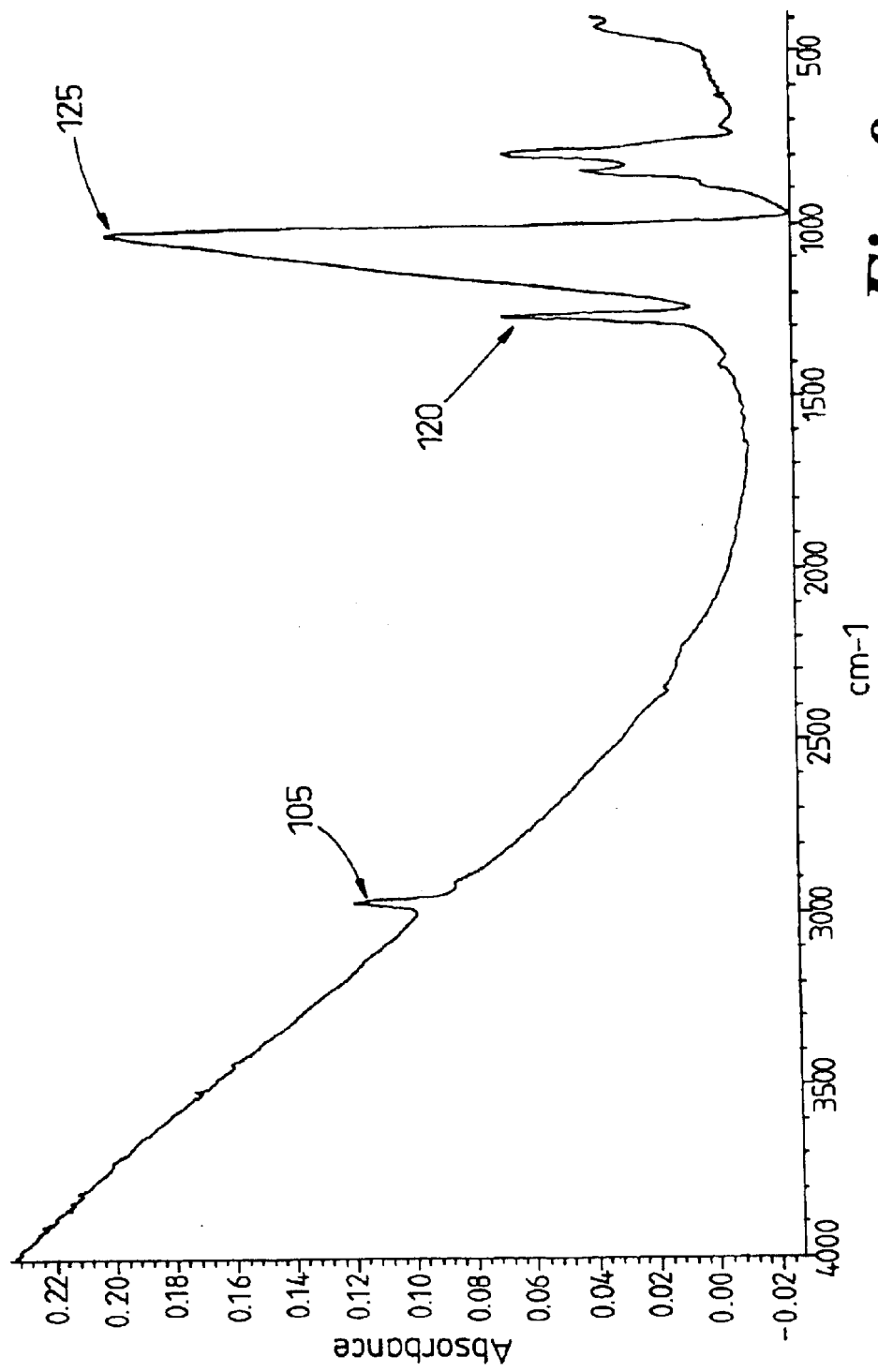
FIG. 8 shows FTIR data for a sample dielectric film prepared with low temperature deposition, after thermal cure.

FIG. 8 shows FTIR data for the sample low-temperature plasma deposited dielectric layer after it was subjected to a standard vacuum thermal cure at approximately 450° C. for 5 minutes. As can be seen, the Si—H FTIR peaks 110, 115 are weak. The dielectric constant k is given in Table 5, above, for two different values indicating a range of experimental results.

Figure 9:
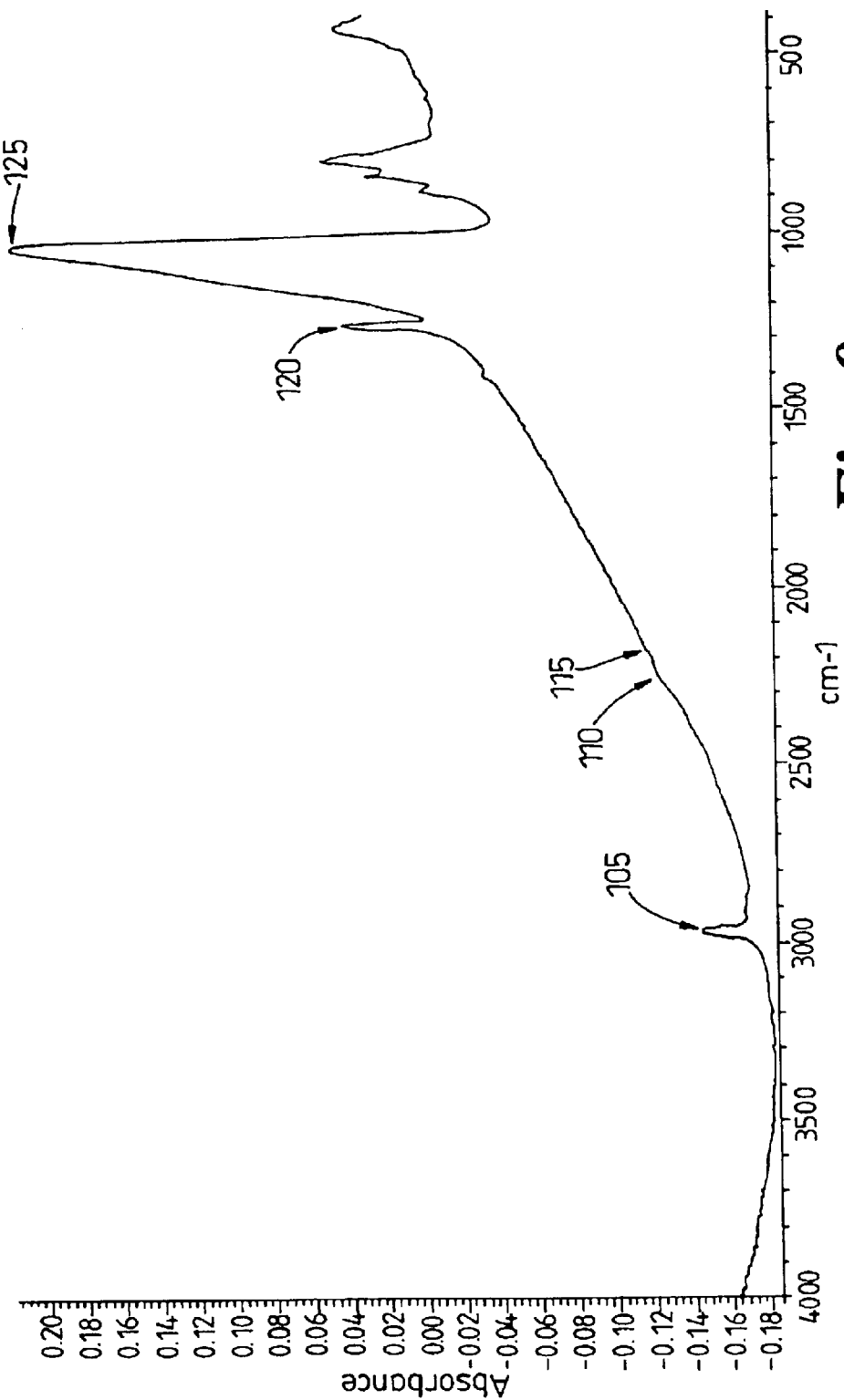
FIG. 9 shows FTIR data for a sample dielectric film prepared with low temperature deposition, after 1 minute of hydrogen plasma treatment.
Figure 10:
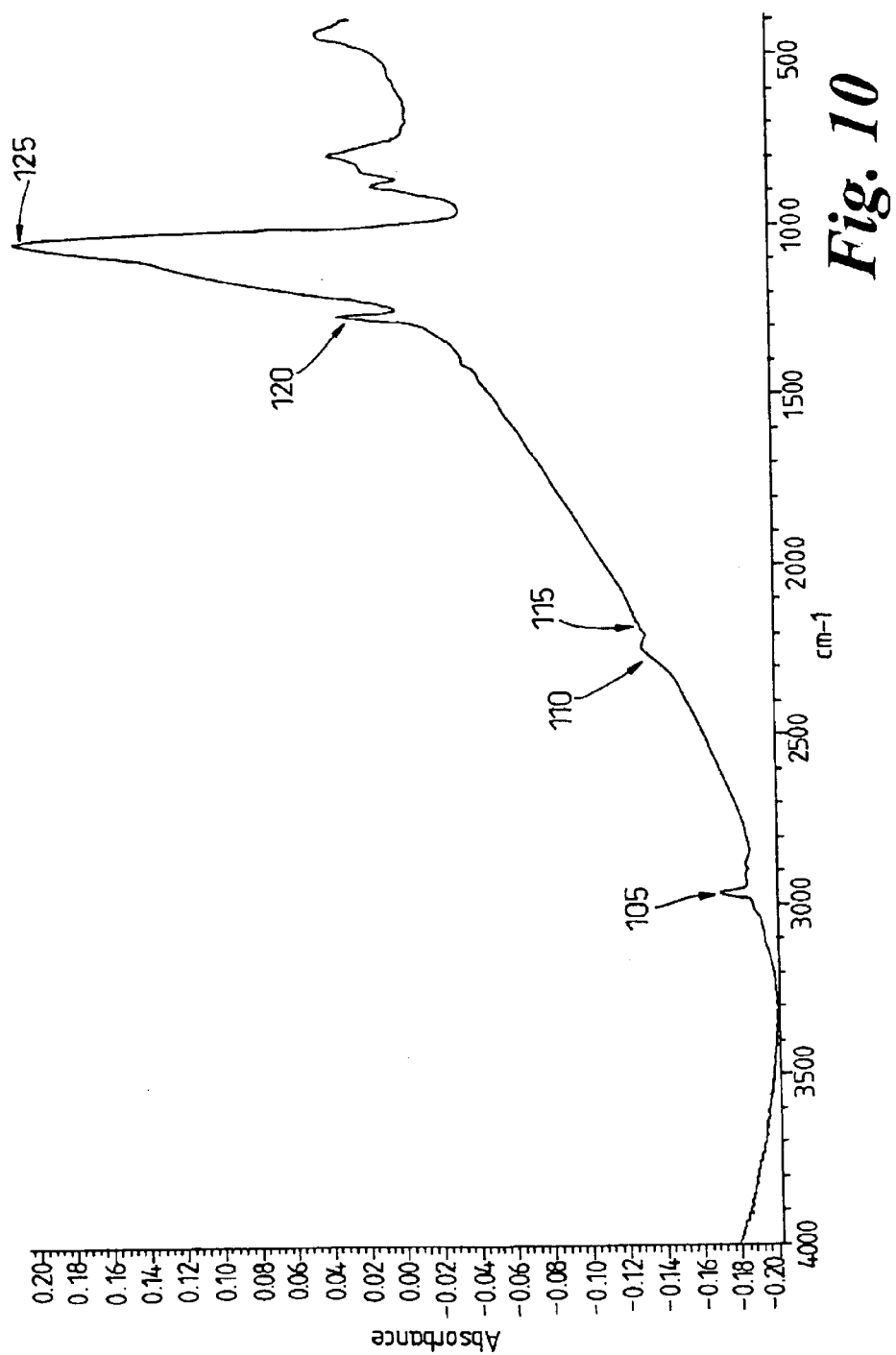
FIG. 10 shows FTIR data for a sample dielectric film prepared with low temperature deposition, after 5 minutes of hydrogen plasma treatment.

FIGS. 9–11 show the FTIR data for the low-temperature deposited sample dielectric layer when the standard vacuum thermal cure was replaced with hydrogen plasma processing for 1 minute (FIG. 9), 5 minutes (FIG. 10), and 30 minutes (FIG. 11). In each case, the plasma process conditions were as set forth in Table 3, above. As before, the best results have been obtained where a plasma is present directly at the dielectric layer but is not sustained by powering the subtemperature (20° C., platen, 100° C. showerhead) to see if the effects seen with 4MS also take place with 3MS in low temperature deposition. Initial results suggest that the effect of a hydrogen plasma are broadly similar, but with the non optimized 3MS processes, the hydrogen plasma effects are not as pronounced as for 4MS.

Figure 12:
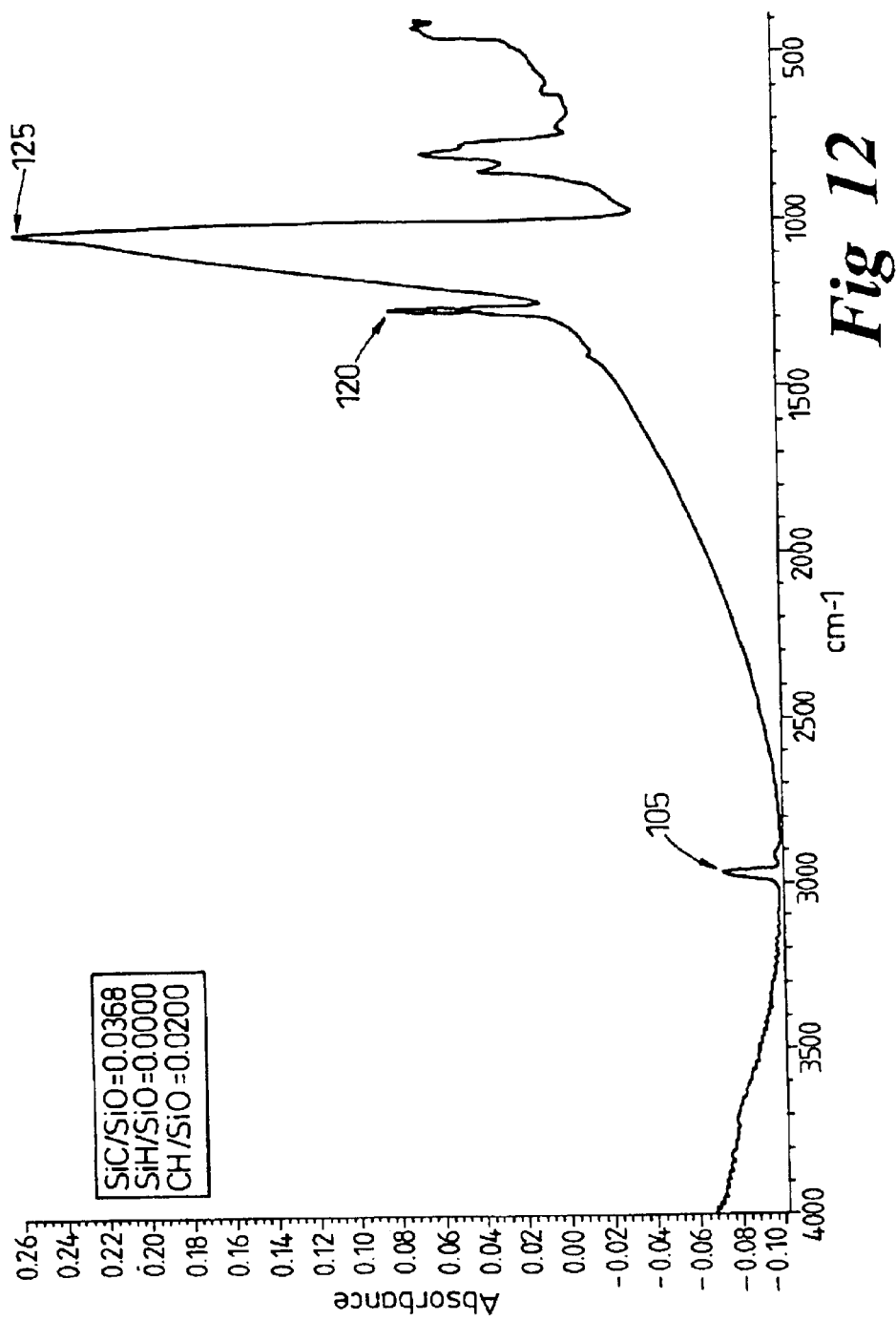
FIG. 12 shows FTIR data for a sample dielectric film prepared with high temperature deposition, prior to thermal cure.

FIG. 12 shows FTIR data for a sample dielectric layer prepared with high temperature plasma deposition using a trimethylsilane (3MS) and $O_2$ reaction, prior to thermal cure.

Figure 13:
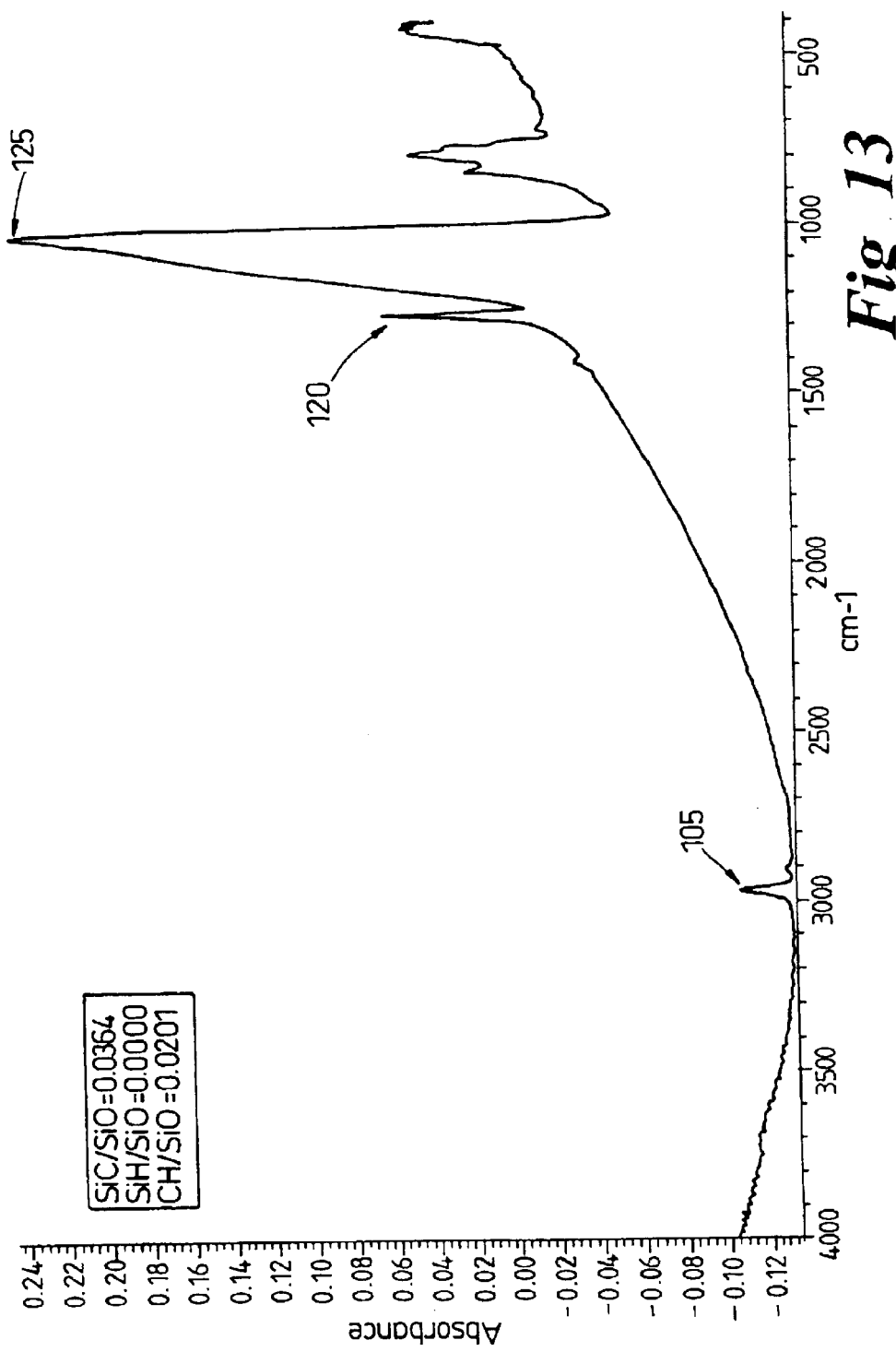
FIG. 13 shows FTIR data for a sample dielectric film prepared with high temperature deposition, after thermal cure.
Figure 14:
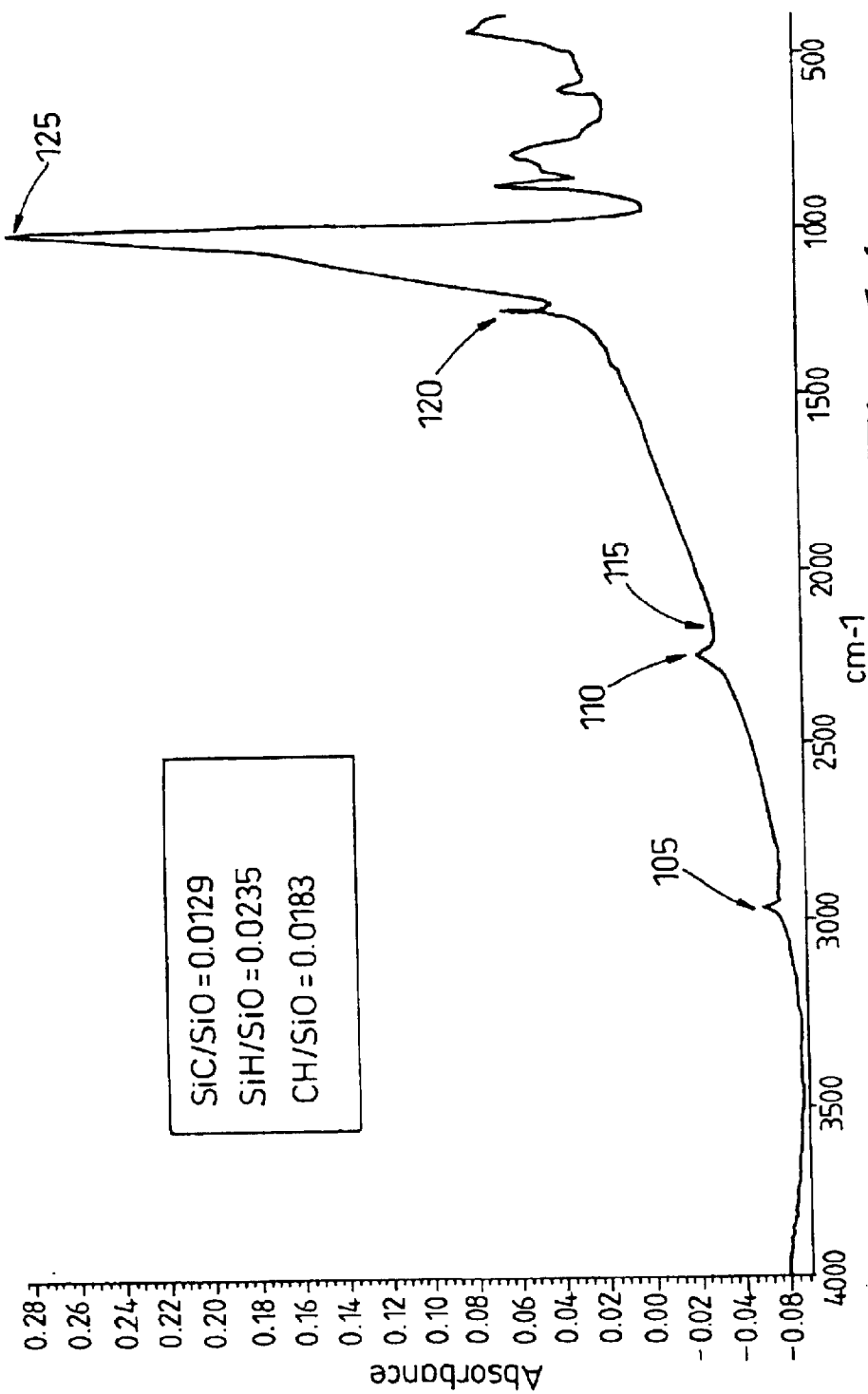
FIG. 14 shows FTIR data for a sample dielectric film prepared with high temperature deposition, after a hydrogen plasma treatment.

FIG. 13 shows FTIR data for the sample high-temperature plasma deposited dielectric layer after it was subjected to a standard vacuum thermal cure at approximately 450° C. for 5 minutes. FIG. 14 shows the FTIR data for the high-temperature deposited sample dielectric layer when the standard vacuum thermal cure was replaced with hydrogen plasma processing, as described above. Upon $H_2$ plasma treatment the same trend identified in the cold plasma deposited dielectric layers occurs. A reduction in the magnitude of the C—H FTIR peak 105 and the Si—$CH_3$ FTIR peak 120, and development of Si—H FTIR peaks 110, 115 occurs. In the case of the Si—H doublet as shown in FIG. 14, the magnitude of the FTIR peak 115 for the lower wave number (approximately 2125 $cm^{-1}$) is less than the magnitude of the FTIR peak 110 for the higher wave number (approximately 2250 $cm^{-1}$). Again a broad area is forming around the C—H FTIR peak 105.

These dielectric layers are generally required to be processed by chemical mechanical polishing. It is found that without a hydrogen plasma treatment these dielectric layers did not survive the shear stress of CMP processing, while the hydrogen plasma processing enabled these dielectric layers to survive well. The k value of this material is typically in the range k=2.8–3.2.

Figure 15:
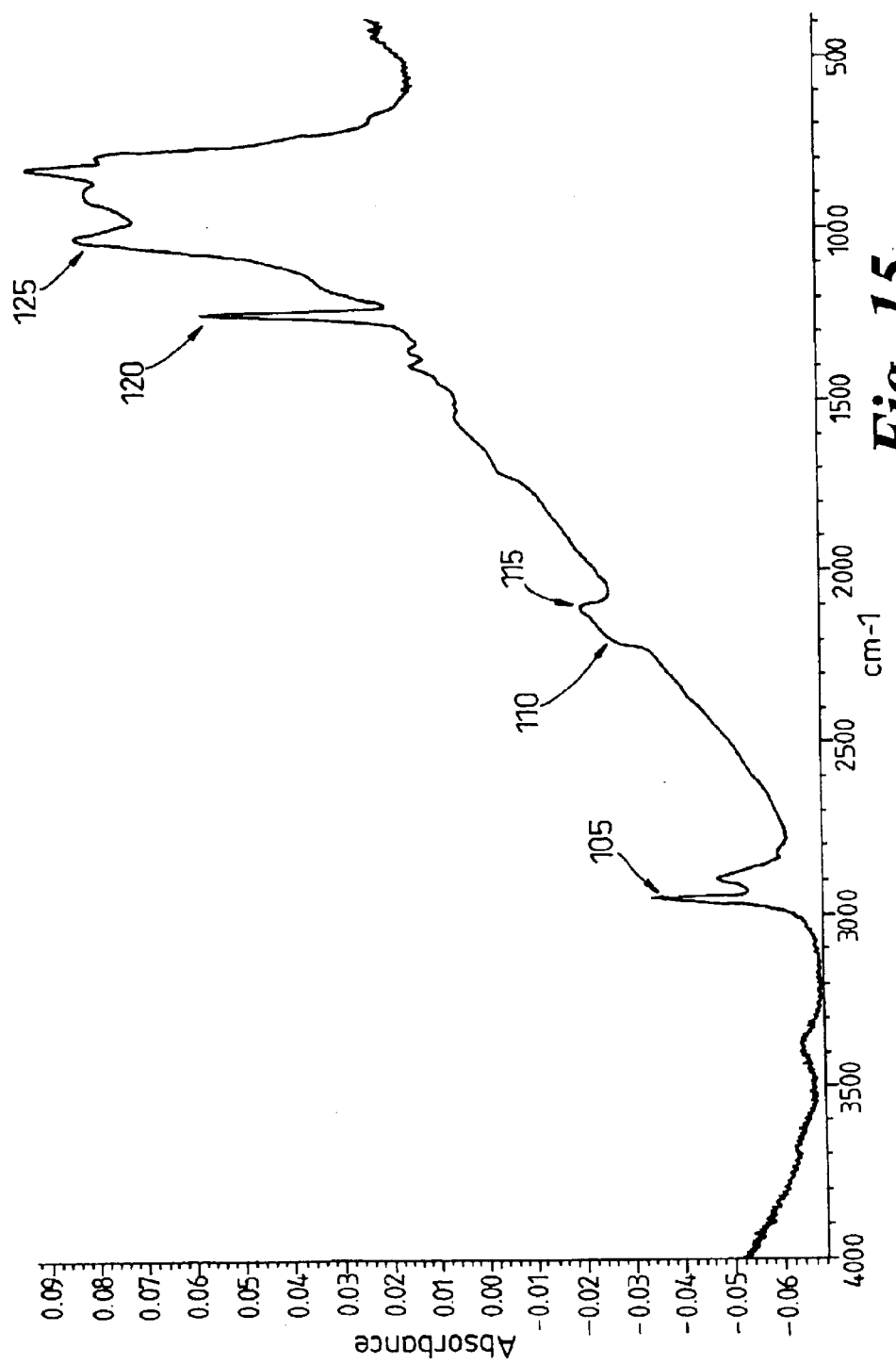
FIG. 15 shows the FTIR spectra of the etch-stop film deposited from a tetramethylsilane and nitrogen based process after a vacuum thermal cure.
Figure 16:
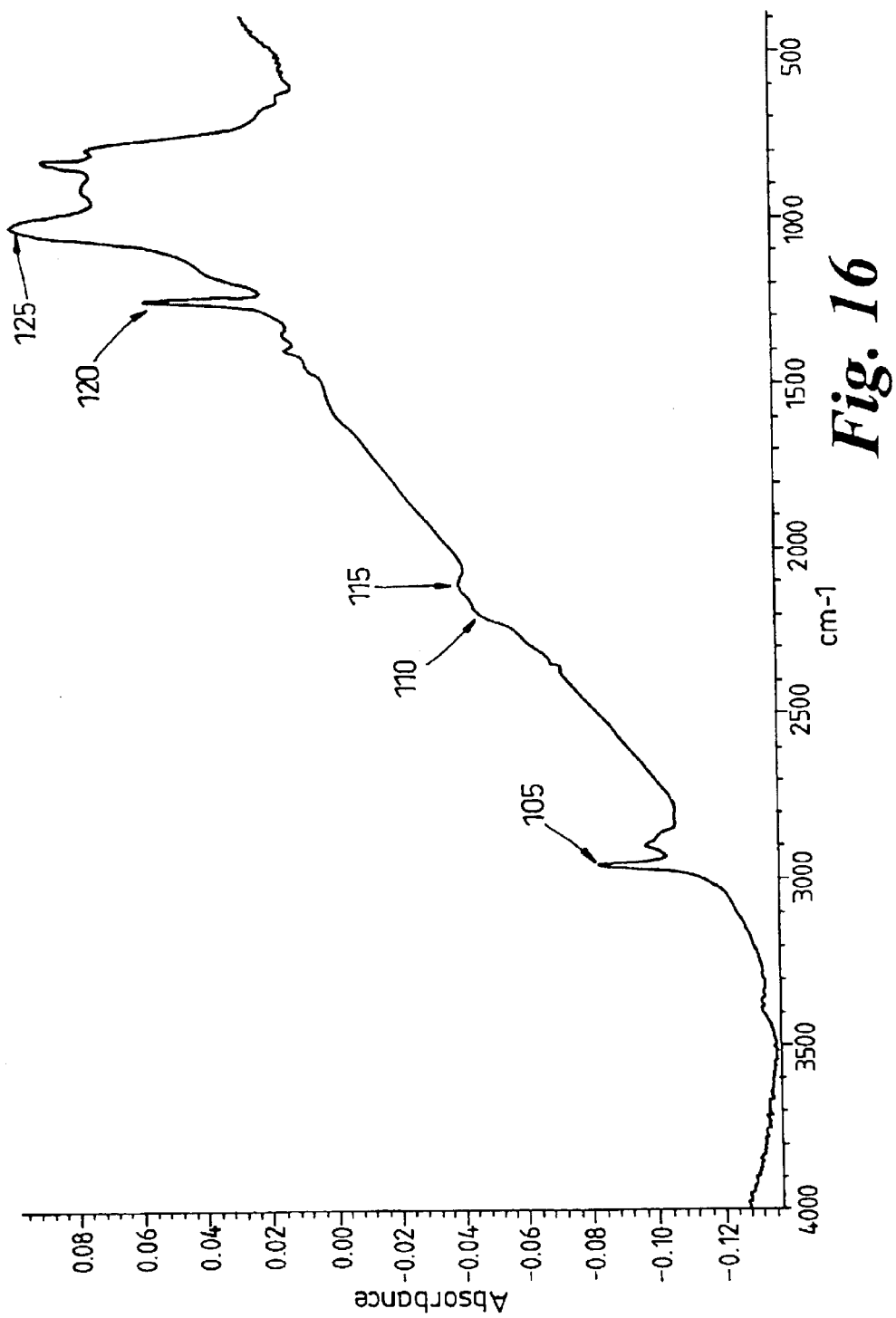
FIG. 16 shows the FTIR spectra of the etch-stop film deposited from a tetramethylsilane and nitrogen based process after a hydrogen plasma treatment.

FIG. 15 shows the FTIR spectra of an etch-stop film deposited from a plasma reaction of tetramethylsilane and nitrogen (4MS/$N_2$) on cold (<60° C.) wafers after a vacuum thermal cure. This is a cold deposition process with N—H observed in the deposited layer (wave number approximately 3400 $cm^{-1}$). FIG. 16 shows the same film with a hydrogen plasma treatment, as described above, substituted for the thermal cure.

These films, while they have a higher dielectric constant than the dielectric layers discussed above, are important for the integration of low k dielectrics into dual damascene structures. Once again the Si—H doublet is observed, and the ratio of the magnitude of the 2250/2125 peaks 110, 115 is greater for the $H_2$ plasma treated film in comparison with the thermally cured film. Again the magnitude of the C—H and Si—$CH_3$ FTIR peaks 105, 120 are reduced in intensity. Again, these cold deposited dielectric layers react to the hydrogen plasma treatment to yield dielectric constant (k) reductions. A 5 minute vacuum thermal process as described above yielded a k value of 2.9, while a 5 minute hydrogen plasma treatment yielded a k value of 2.7. Longer plasma treatments would be expected to reduce this k value even lower.

It can be seen, e.g. in Table 5 above, that under the influence of the hydrogen plasma there is a significant reduction in the Si—$CH_3$/Si—O ratio and the FTIR spectra (e.g. compare FIGS. 7 and 11) shows a significant reduction in the magnitude of the Si—$CH_3$ peak 120. Accordingly, it is believed that the carbon and hydrogen from excess' methyl groups are redistributed into other bonds such as (C—$H_2$)n. This process is illustrated in FIG. 17.

Figure 17:
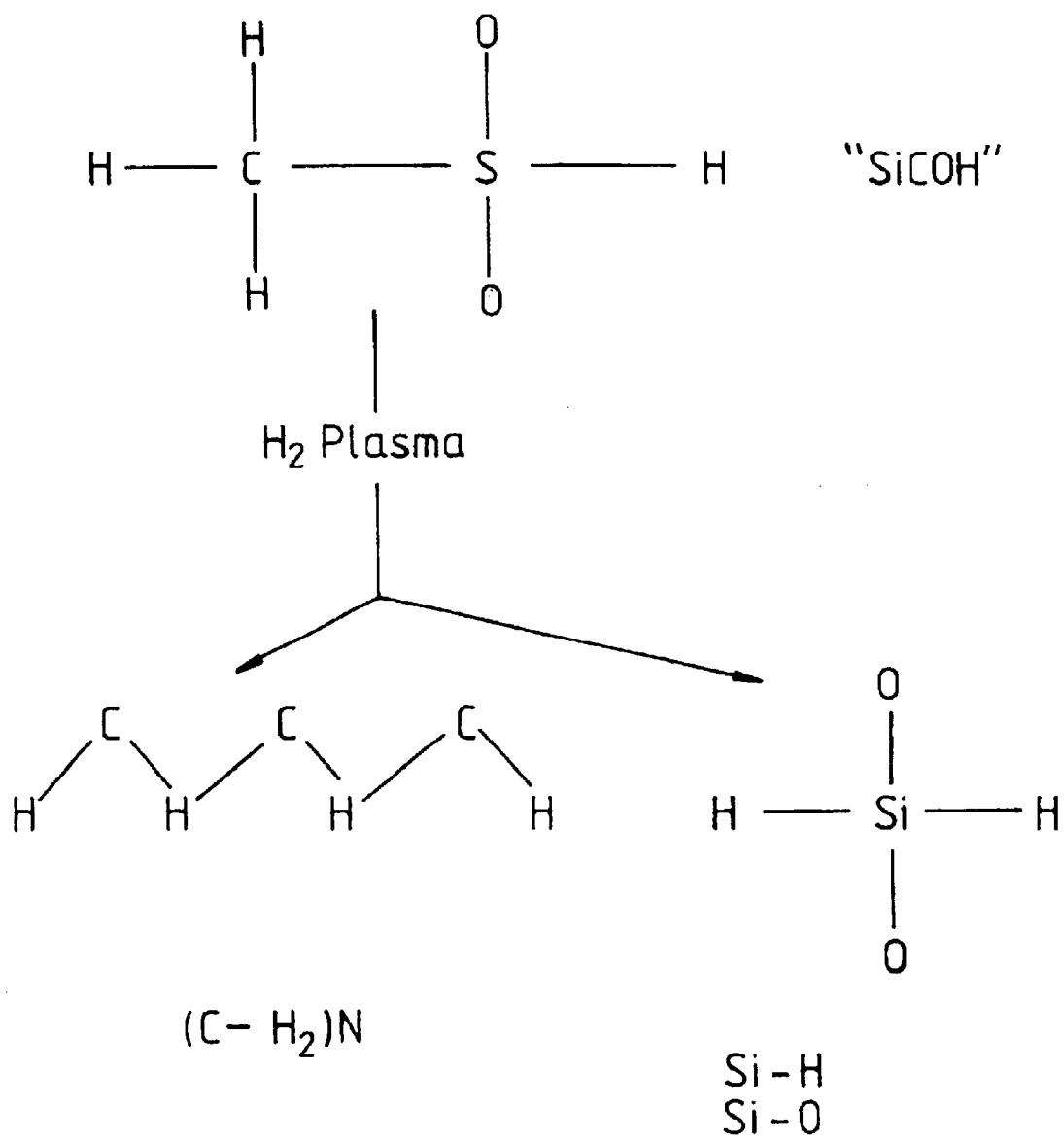
FIG. 17 illustrates how $H_2$ plasma may react with surplus methyl groups to form $C-H_2$ chains.

At the top of FIG. 17, methyl bonded to hydrogenated silicon dioxide is illustrated. S—$CH_3$, Si—O, C—H and Si—H bonds are present. Under the influence of the plasma and hydrogen some of the methyl groups are broken away and broken up allowing (C—$H_2$)n chains to form and an increase in Si—H bonding as shown at the bottom of FIG. 17.

In general, $H_2$ plasma treatment reduces the Si—$CH_3$ FTIR peak 120 and the C—H FTIR peak 105, while the Si—H stretching vibrational FTIR peaks are significantly modified. Depending on the intensity or the duration of the $H_2$ plasma, the higher wave number FTIR peak 115 is increased in magnitude relative to the lower wave number FTIR peak 110 of the Si—H doublet.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the scope of the appended claims.

What is claimed is:

1. A semiconductor device comprising a dielectric layer having a methyl group and exhibiting an SI—H Fourier Transform Infrared (FTIR) doublet defined by a first and a second peak, wherein the first peak is located at a higher wave number than the second peak, and wherein the ratio of the first peak to the second peak is greater than unity.

2. The semiconductor device as claimed in claim 1, wherein a dielectric constant of the dielectric layer is less than 3.

3. A semiconductor device comprising a dielectric layer having a methyl group and exhibiting a C—H Fourier Transform Infrared (FTIR) peak, an Si—$CH_3$ ETIR peak, and an SI—H FTIR doublet defined by a first and a second peak, wherein the first peak is located at a higher wave number than the second peak, and wherein the ratio of the first peak to the second peak is greater than unity.

4. The semiconductor device as claimed in claim 3, wherein a dielectric constant of the dielectric layer is less than 3.

* * * * *